United States Patent
Lin et al.

(10) Patent No.: US 6,948,948 B2
(45) Date of Patent: Sep. 27, 2005

(54) PC CARTRIDGE HAVING ENHANCED FRONT CONNECTING STRUCTURE

(75) Inventors: Anderson Lin, Taipei Hsien (TW); Oswald Ku, Taipei Hsien (TW)

(73) Assignee: D&C Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/600,341

(22) Filed: Jun. 23, 2003

(65) Prior Publication Data

US 2004/0070928 A1 Apr. 15, 2004

Related U.S. Application Data

(63) Continuation-in-part of application No. 10/207,035, filed on Jul. 3, 2002, now abandoned.

(51) Int. Cl.⁷ ............................................... H01R 12/00
(52) U.S. Cl. ....................................................... 439/76.1
(58) Field of Search ......................... 439/76.1, 95, 92, 439/91, 101, 108, 946; 361/737

(56) References Cited

U.S. PATENT DOCUMENTS 5,493,477 A * 2/1996 Hirai ........................... 361/737
5,572,408 A * 11/1996 Anhalt et al. ................ 361/737
6,049,462 A * 4/2000 Lin .............................. 361/737
6,191,950 B1 * 2/2001 Cox et al. .................... 361/737
6,269,537 B1 * 8/2001 Kimura et al. ................ 29/832

* cited by examiner

*Primary Examiner*—P. Austin Bradley
*Assistant Examiner*—Phuongchi Nguyen
(74) *Attorney, Agent, or Firm*—Leong C. Lei

(57) ABSTRACT

A PC cartridge having enhanced front connecting structure is disclosed. Two folded hooks with n-shaped structure are on the same side of the front connector and at two front corners of the upper shell. The folded hook defines a small height and has a rearward opening. Further, first and second flanges are located on the same side of the front connector and at the front ends of the packing rubbers located on the bottom shell. Especially, first and second flanges are parts extended from the packing rubbers, whereby retaining slots are formed between upper and bottom shells. Both the second flanges comprise a third flange projected forward. The folded hooks conform to the third flange and extend into the retaining slots so as to engage the upper shell with the bottom shell.

2 Claims, 3 Drawing Sheets

PC CARTRIDGE HAVING ENHANCED FRONT CONNECTING STRUCTURE

This application is a continuation-in-part of U.S patent application Ser. No. 10/207,035, filed Jul. 30, 2002, now abandoned.

BACKGROUND OF THE INVENTION

1. Field of the Invention

The present invention relates to improvements made to a PC cartridge, and more particularly to a PC cartridge having enhanced front connecting structure that enables coupled upper and bottom shells of the PC cartridge to resist higher vertical pull applied on them and thereby protects the PC cartridge from easy deformation and ensures secure and reliable mounting of connection ports on the PC cartridge.

2. Description of the Prior Art

FIG. 1 shows a conventional PC cartridge that is mainly formed from an upper shell A1, a bottom shell A2, packing rubbers A3 provided on two sides of the bottom shell A2, and two connection ports A4a and A4b. A4a is a front connector located at the front end of the PC cartridge so as to connect a computer or other peripheral circuit. On the contrary, A4b is a rear connector located at the rear end of the PC cartridge so as to connecting cables. Both the upper and the bottom shells A1, A2 are provided at front and rear ends adjacent to the connection ports A4a and A4b with locating flanges A5. Each of the locating flanges A5 has a free end inclining toward the connection ports A4a and A4b, and each of the connection ports A4a and A4b is provided at upper and lower sides with coupling holes A11 corresponding to the locating flange A5. When the conventional PC cartridge of FIG. 1 is fully assembled., the locating flanges AS are set in the coupling holes A11 and therefore do not easily become warped to produce any gap. Since the front and the rear end of the upper and the bottom shell are properly received in the coupling holes, they are not easily subjected to damages and deformation due to external forces. Thus, components received in the conventional PC cartridge are well protected against dust that might otherwise enter the PC cartridge due to gaps between warped upper and bottom shells, and no hardware interference would occur at the time the conventional PC cartridge is inserted into or extracted from a slot on a computer.

The conventional PC cartridge of FIG. 1 is also provided at the packing rubbers A3 with front hook holes A9 for engaging with front hooks A7 provided at two front corners of the upper shell A1, and at two longitudinal sides of the upper shell A1 with L-shaped coupling flanges A6 for engaging with flanges or grooves provided at the packing rubbers A3. These arrangements allow the upper shell A1 and the bottom shell A2 to securely connect to one another by hooking their front ends together and snapping their rear ends together. No gap is left between the two shells to cause any looseness of the conventional PC cartridge of FIG. 1.

The conventional PC cartridge of FIG. 1 is further provided at two rear corners of the upper shell A1 with rear hooks A8. The rear hooks A8 are so configured that they could be snapped onto the bottom shell A2 after the front hooks A7 have been engaged with the front hook holes A9. To disassemble the PC cartridge of FIG. 1, simply upward pull the upper shell A1 at its front end to remove the upper shell A1 from the bottom shell A2. The conventional PC cartridge of FIG. 1 could therefore be very easily assembled and disassembled.

Tests prove the above-described coupling structure for the conventional PC cartridge of FIG. 1 enables reliable connection of the upper shell to the bottom shell. However, the engagement of the front hooks A7 with the front hook holes A9 does not provide fully sufficient coupling stress.

SUMMARY OF THE INVENTION

It is one of the objects in this invention to provide an improved PC cartridge having enhanced front connecting structure, so that two coupled upper and bottom shells of the PC cartridge could resist higher vertical pull applied on them to more effectively protect the PC cartridge from easy deformation.

More particularly, the present invention provides two folded hooks with n-shaped structures on the same side of the front connector and at two front corners of the upper shell The folded hook defines a small height and has a rearward opening. Further, the first and second flanges are located on the same side of the front connector and at the front ends of the packing rubbers located on the bottom shell. Especially, first and second flanges are parts extended from the packing rubbers, whereby retaining slots are formed between upper and bottom shells.

On the other hand, both the second flanges comprise a third flange projected forward. The folded hooks conform to the third flange and extend into the retaining slots so as to engage the upper shell with the bottom shell It is noticed that the top of the first flanges is about higher than the bottom of the third flanges The first flanges are utilized to protect the down half part of folded hooks to prevent deforming the folded hooks and contacting inner thereof from the surroundings. Furthermore, the first flanges could also avoid aggregation of dust

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2:
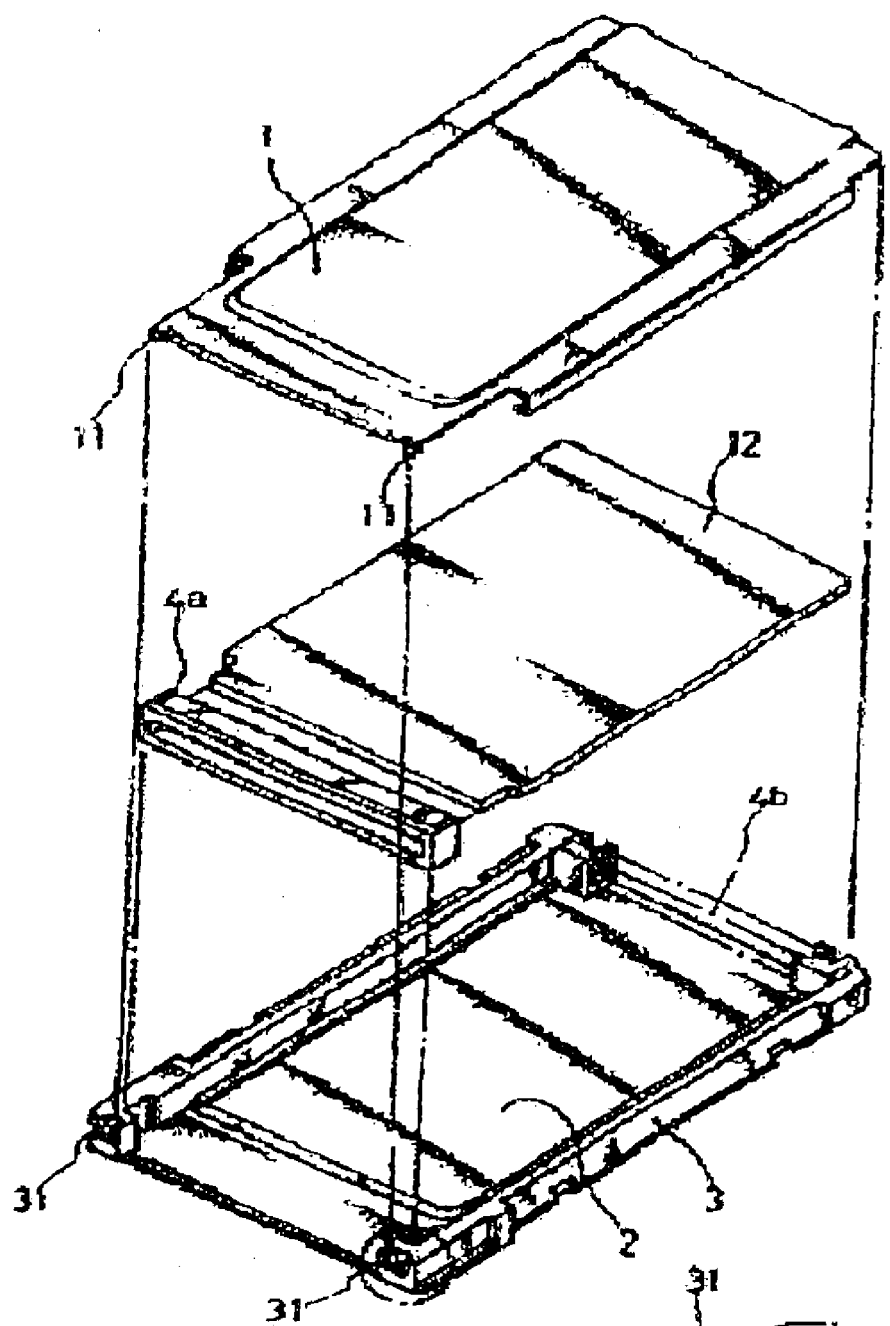
FIG. 2 is an exploded perspective view of a PC cartridge according to the present invention.

In accordance with the present invention, a PC cartridge having enhanced front connecting structure is disclosed. As shown in FIG. 2, the PC cartridge comprises an upper shell 1, a bottom shell 2, packing rubbers 3 located on two sides of the bottom shell 2, and connection ports 4a and 4b. 4a is a front connector located at the front end of the PC cartridge so as to connect a computer or other peripheral circuit; On the contrary, 4b is a rear connector located at the rear end of the PC cartridge so as to connect cables. A space is formed between the upper shell and the bottom shell so as to accommodat a circuit board 12 that stores predetermined software and data.

Figure 4:
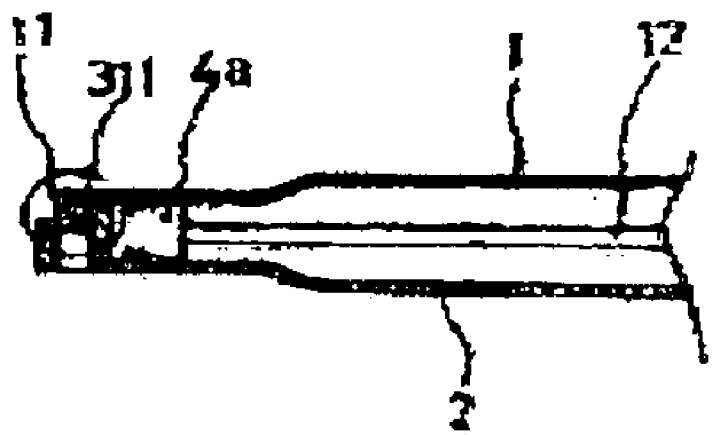
FIG. 4 is a fragmentary sectioned side view of the PC cartridge of the present invention showing the engagement of the front folded hook of the upper shell with the flange portion of the retaining slot on the packing rubber.
Figure 5:
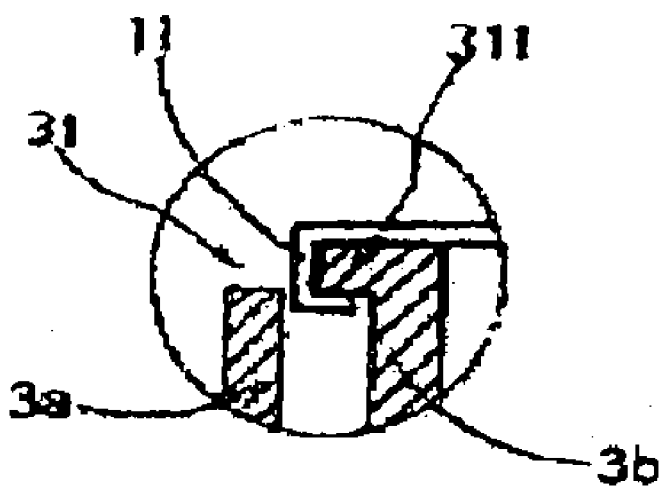
FIG. 5 is a fragmentary and enlarged view of the circled area of FIG. 4.

It is one of the objects in this invention to provide two folded hooks 11 on the same side of the front connector 4a and at two front corners of the upper shell 1. Each of the folded hooks 11 has an n-shaped structure. More specifically, the folded hook 11 defines a small height and has a rearward opening, as is shown in FIGS. 4 and 5. Further, first and second flanges 3a/3b are located on the same side of the front connector 4a and at the front ends of the packing rubbers 3 located on the bottom shell 2. Especially, first and second flanges 3a/3b are parts extended from the packing rubbers 3, whereby retaining slots 31 are formed between 3a and 3b.

Figure 3:
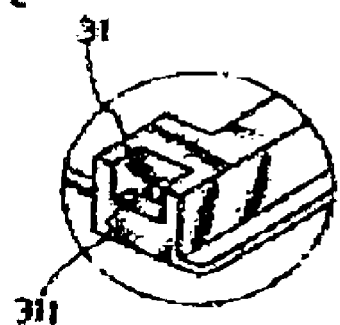
FIG. 3 is a fragmentary and enlarged view of the circled area of FIG. 2 showing the retaining slot provided on a front portion of the packing rubber of the PC cartridge of the present invention.

Referring to FIGS. 3 to 5, both the second flanges 3b comprise a third flange 311 projected forward to 3a direction, such that the folded hooks 11 extend forward to 3b direction into the retaining slot 31. The folded hooks 11 conform to the third flange and extend into the retaining slots 31 so as to engage the upper shell 1 with the bottom shell 2 The structure of folded hooks 11 engaged with retaining slot 31 is shown in FIG. 5, it is noticed that the top of the first flanges 3a is about higher than the bottom of the third flanges 311. The first flanges 3a are utilized to protect the down half part of folded hooks 11 to prevent deforming the folded hooks 11 and contacting inner thereof from the surroundings. Furthermore, the first flanges 3a could also avoid aggregation of dust.

Figure 1:
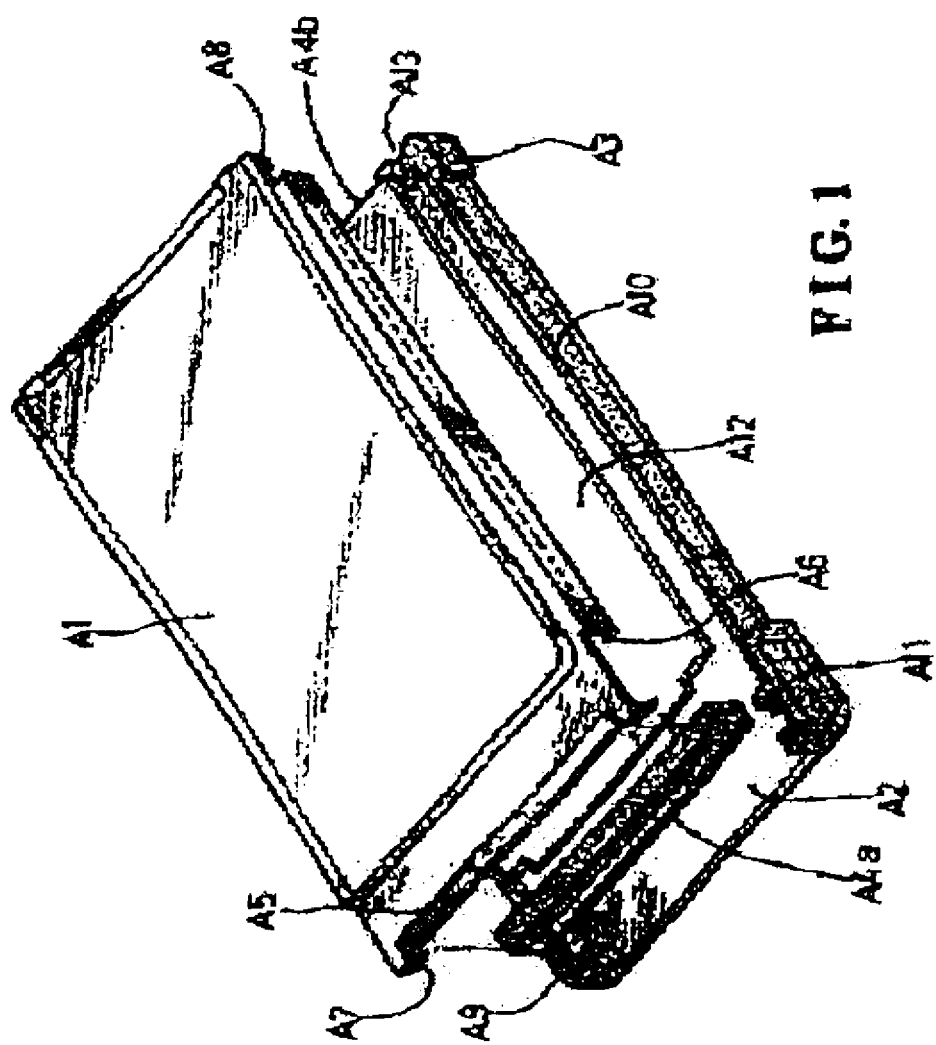
FIG. 1 is an exploded perspective view of a conventional PC cartridge.

According to the mentioned structure of folded hook 11 engaged with retaining slot 31, which makes the front connection port 4a connect computer or other peripheral circuit more securely and reliably. Furthermore, some tests are done to confirm that this invention do provide increased coupling stress of PC cartridges. After the folded hooks 11 on the upper shell 1 are fitly engaged with the flange portions 311 of the retaining slots 31 on the bottom shell 2, both a vertical pull applied on the upper and the bottom shells 1, 2 to separate the two shells and a backward pull applied on the upper shell 1 to pull the same toward the bottom shell 2 are larger than a coupling stress of the connection structure of the conventional PC cartridge of FIG. 1. Moreover, the problem of warped openings between upper and bottom shells 1, 2 may be effectively avoided, and the secure mounting of the connection ports 4 in the PC cartridge can be ensured.

Although specific embodiments have been illustrated and described, it will be obvious to those skilled in the art that various modifications may be made without departing from what is intended to be limited solely by the appended claims.

What is claimed is:

1. A PC cartridge having an enhanced front connecting structure, comprising:
   an upper shell;
   a bottom shell;
   a plurality of packing rubbers located on two sides of said bottom shell;
   a plurality of connection ports having a front connection port for connecting a computer or other peripheral circuit and a rear connector for connecting cables;
   a plurality of folded hooks with n-shaped structure at two front corners of said upper shell, wherein said plurality of folded hooks are on a same side of said front connection port;
   a plurality of retaining slots at two front ends of said packing rubbers for engaging with said plurality of folded hooks, said plurality of retaining slots being on the same said of said front connection port; and
   a first flange, a second flange and a third flange at front ends of said plurality of packing rubbers, said plurality of retaining slots being formed between said first flange and said second flange, said third flange extending from said second flange and projecting forward in a direction of said first flange.

2. The PC cartridge according to claim 1, wherein said plurality of folded hooks conform to said third flange and extend into said plurality of retaining slots so as to engage said upper shell with said bottom shell.

* * * * *